United States Patent
Mizutani et al.

(10) Patent No.: US 10,396,039 B2
(45) Date of Patent: Aug. 27, 2019

(54) SEMICONDUCTOR PACKAGE

(71) Applicant: Mitsubishi Electric Corporation, Tokyo (JP)

(72) Inventors: Hiroyuki Mizutani, Tokyo (JP); Hidenori Ishibashi, Tokyo (JP); Hideharu Yoshioka, Tokyo (JP); Kiyoshi Ishida, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/525,499

(22) PCT Filed: Dec. 9, 2014

(86) PCT No.: PCT/JP2014/082544
§ 371 (c)(1),
(2) Date: May 9, 2017

(87) PCT Pub. No.: WO2016/092633
PCT Pub. Date: Jun. 16, 2016

(65) Prior Publication Data
US 2017/0330838 A1 Nov. 16, 2017

(51) Int. Cl.
*H01L 23/552* (2006.01)
*H01L 23/00* (2006.01)
(Continued)

(52) U.S. Cl.
CPC ........ *H01L 23/552* (2013.01); *H01L 23/3107* (2013.01); *H01L 23/4952* (2013.01); *H01L 23/49541* (2013.01); *H01L 23/49551* (2013.01); *H01L 23/49582* (2013.01); *H01L 24/48* (2013.01); *H01L 24/73* (2013.01);
(Continued)

(58) Field of Classification Search
CPC ... H01L 23/552; H01L 24/48; H01L 23/3107; H01L 24/97; H01L 23/49582; H01L 24/73; H01L 2224/97; H01L 2224/73265; H01L 2224/48247; H01L 2224/32245
See application file for complete search history.

(56) References Cited

U.S. PATENT DOCUMENTS

| 7,964,938 B2 | 6/2011 | Yoon et al. |
| 8,053,872 B1 * | 11/2011 | Swan ................. C25D 5/12 257/659 |

(Continued)

FOREIGN PATENT DOCUMENTS

| JP | 2002-033/111 A | 1/2002 |
| JP | 2003-031987 A | 1/2003 |

(Continued)

OTHER PUBLICATIONS

International Search Report issued in PCT/JP2014/082544; dated Jan. 13, 2015.
(Continued)

*Primary Examiner* — Stephen M Bradley
*Assistant Examiner* — Wasiul Haider
(74) *Attorney, Agent, or Firm* — Studebaker & Brackett PC (57) ABSTRACT

A lead frame includes: a second terminal that is disposed to surround terminals on a package plane and can be grounded; and a conductive member that covers molded resin and is electrically connected to the second terminal.

3 Claims, 5 Drawing Sheets

(51) Int. Cl.
  *H01L 23/495* (2006.01)
  *H01L 23/31* (2006.01)
  *H01L 23/29* (2006.01)
  *H01L 21/56* (2006.01)

(52) U.S. Cl.
  CPC ............ *H01L 24/97* (2013.01); *H01L 21/561* (2013.01); *H01L 23/293* (2013.01); *H01L 24/32* (2013.01); *H01L 24/45* (2013.01); *H01L 2224/32245* (2013.01); *H01L 2224/45124* (2013.01); *H01L 2224/45144* (2013.01); *H01L 2224/48247* (2013.01); *H01L 2224/73265* (2013.01); *H01L 2224/97* (2013.01); *H01L 2924/181* (2013.01); *H01L 2924/1815* (2013.01); *H01L 2924/19107* (2013.01)

(56) References Cited

U.S. PATENT DOCUMENTS

| | | | | |
|---|---|---|---|---|
| 8,093,691 | B1* | 1/2012 | Fuentes | H01L 23/3128 257/659 |
| 2005/0067676 | A1 | 3/2005 | Mahadevan et al. | |
| 2009/0294930 | A1 | 12/2009 | Yoon et al. | |
| 2011/0049685 | A1 | 3/2011 | Park et al. | |
| 2011/0175210 | A1* | 7/2011 | Yao | H01L 23/552 257/659 |
| 2012/0241922 | A1* | 9/2012 | Pagaila | H01L 21/4832 257/659 |
| 2015/0380384 | A1* | 12/2015 | Williams | H01L 24/97 438/112 |

FOREIGN PATENT DOCUMENTS

| | | |
|---|---|---|
| JP | 2007-507108 A | 3/2007 |
| JP | 2009-290217 A | 12/2009 |
| JP | 4833319 B2 | 12/2011 |
| JP | 2014-183142 A | 9/2014 |

OTHER PUBLICATIONS

An Office Action; "Notice of Reasons for Rejection," mailed by the Japanese Patent Office dated Dec. 22, 2016, which corresponds to Japanese Patent Application No. 2016-563325 and is related to the present application.

An Office Action; "Notification of Reasons for Refusal," issued by the Japanese Patent Office dated May 23, 2017, which corresponds to Japanese Patent Application No. 2016-563325 and is related to U.S. Appl. No. 15/525,499; with English language translation.

The extended European search report issued by the European Patent Office dated Jun. 13, 2018, which corresponds to European Patent Application No. 14907653.1-1212 and is related to U.S. Appl. No. 15/525,499.

An Office Action mailed by the Japanese Patent Office dated Jul. 17, 2018, which corresponds to Japanese Patent Application No. 2017-210620 and is related to U.S. Appl. No. 15/525,499.

* cited by examiner

SEMICONDUCTOR PACKAGE

TECHNICAL FIELD

The present invention relates to a semiconductor package that has a function of shielding electromagnetic waves.

BACKGROUND ART

Semiconductor packages having various structures are used, each of which contains an electronic component such as an integrated circuit (IC) chip. Among these semiconductor packages, the one having a lead frame is widely used (e.g., a Quad Flat No Lead (QFN) package). The lead frame is made of thin plate metal which is used for fixing the IC chip and also used as an internal wire of the semiconductor package.

In the semiconductor package, such as the QFN package, the IC chip is bonded to a die pad of the lead frame with silver paste, solder, or the like. A terminal of the lead frame and the IC chip are electrically connected via a gold wire or an aluminum wire. After that, the IC chip and the wire are sealed by epoxy resin or the like in order to protect against humidity, dust, and external stress. The semiconductor package is manufactured through the above-described process. Those semiconductor packages may bring an advantage of being inexpensive and being excellent at the radiation of heat which is occurring in the IC chip.

Meanwhile, as for an electronic device, it is required to suppress unnecessary electromagnetic interference between electronic components in order to prevent malfunction. In the above-described semiconductor package, part of signals input or output to/from the IC chip may be radiated from the terminal and the wires as electromagnetic waves. Although the IC chip is covered with epoxy resin or the like, it is not covered with a conductive member such as metal. Therefore, electromagnetic waves are radiated outside from the semiconductor package. When the radiated electromagnetic waves cause interference between a plurality of semiconductor packages, the malfunction of the electronic device may occur.

As a semiconductor package which is capable of shielding electromagnetic waves occurring in the package, there is a structure disclosed in Patent Literature 1, for example. This is a semiconductor package, in which an IC chip is covered by a ceramic or metal cap having surfaces covered with conductive material, and the cap is attached to a radiator plate via a fin and a screw being attached to the side of the cap. In the semiconductor package, the cap, the fin, the screw, and the radiator plate are formed of conductive members, such as metal, and are electrically connected. Therefore, electromagnetic waves can be shielded.

In addition, as disclosed in Patent Literature 2, there is a structure, in which an IC chip is mounted on a printed circuit board in place of the lead frame, and wire bonding and resin molding are performed, and, after that, the surface of the molded resin is coated with an electromagnetic wave shielding coating.

Patent Literature 1: JP 2003-31987 A
Patent Literature 2: JP 2009-290217 A

SUMMARY OF INVENTION

However, in the configuration disclosed in Patent Literature 1, the ceramic cap may be expensive. In addition, spaces for attaching the fin and the screw are needed on the side of the cap. This fact may bring about a problem that the semiconductor package becomes larger in size.

On the other hand, in the configuration described in Patent Literature 2, the IC chip is mounted on the printed circuit board. This structure may bring about a problem that heat radiation property is inferior to that in a case where the IC chip is mounted on a lead frame.

The present invention has been devised for solving the above-described problems. The object of the present invention is to provide a semiconductor package that has a smaller size with inexpensive, and also has better heat radiation property and shielding property for electromagnetic waves as compared with the conventional configuration.

The semiconductor package according to the present invention includes: an electronic component; a lead frame that includes a die pad, on which the electronic component is fixed, and terminals being internal wires; a wire to connect the electronic component and the terminals; and molded resin to seal the electronic component and the wire; a second terminal that is disposed to surround the terminals on a package plane and can be grounded, the second terminal being included in the lead frame; and a conductive member that covers the molded resin and is electrically connected to the second terminal.

According to the present invention, with the above-described configuration, it is capable of downsizing the semiconductor package with inexpensive, and having better heat radiation property and shielding property for electromagnetic waves as compared with the conventional configuration.

DESCRIPTION OF EMBODIMENTS

Embodiments of the present invention will be described in detail below with reference to the drawings.

Embodiment 1

Figure 1:
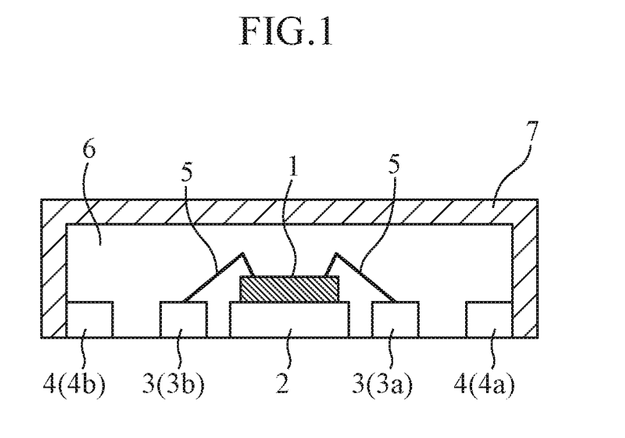
FIG. 1 is a cross-sectional diagram illustrating a configuration of a semiconductor package according to Embodiment 1 of the present invention.

FIG. 1 is a cross-sectional diagram illustrating a configuration of a semiconductor package according to Embodiment 1 of the present invention.

The semiconductor package uses a lead frame being thin plate metal, and has a built-in IC chip (electronic component) 1. As illustrated in FIG. 1, the lead frame has a die pad 2, on which the IC chip 1 is fixed, and terminals 3 being internal wires of the semiconductor package. The IC chip 1 is disposed on the top surface of the die pad 2. The die pad 2 is utilized for heat radiation as well as fixing of the IC chip 1.

The terminals 3 are disposed to surround the die pad 2 on a package plane. The terminals 3 are used for inputting and outputting signals or power. In FIG. 1, two terminals 3a and 3b are depicted. The bottom surfaces of the terminals 3 are exposed to the outside. The terminals 3 are formed to be connectable to a signal terminal or a power supply terminal on a printed circuit board (not illustrated) on which the semiconductor package is to be mounted. The other surfaces of the terminals 3 are covered with molded resin 6. Note that, in a case where many signal terminals or power supply terminals are needed, the terminals 3 may be formed to be wound twice or more.

The lead frame also has a terminal (second terminal) 4 disposed to surround the terminals 3 on the package plane. The terminals 4 may be discretely disposed in an island-shaped manner, or may be connected to be a series. In the example illustrated in FIG. 1, two terminals 4a and 4b are depicted, each of which is the terminal 4. The bottom surface of the terminal 4 is exposed to the outside. The terminal 4 is formed to be connectable to a ground terminal on the above-described printed circuit board (or formed to be capable of grounding). In addition, outer sides of the terminal 4 (the left side of the terminal 4a and the right side of the terminal 4b in a view of FIG. 1) are exposed to the outside, or in contact with a conductive coating (conductive member) 7. The other surfaces of the terminal 4 are covered with the molded resin 6.

A terminal on the IC chip 1 and the terminals 3 are electrically connected via a wire 5. The IC chip 1 and the wire 5 are sealed by the molded resin 6 to protect against humidity, dust, and external stress.

The molded resin 6 is covered by the conductive coating 7. In the example illustrated in FIG. 1, the conductive coating 7 covers the top surface and the sides of the molded resin 6, and the outer sides of the terminal 4. The conductive coating 7 and the terminal 4 are electrically connected.

Next, a manufacturing process of the semiconductor package having the above-described configuration will be briefly described with reference to FIG. 2.

Figure 2A:
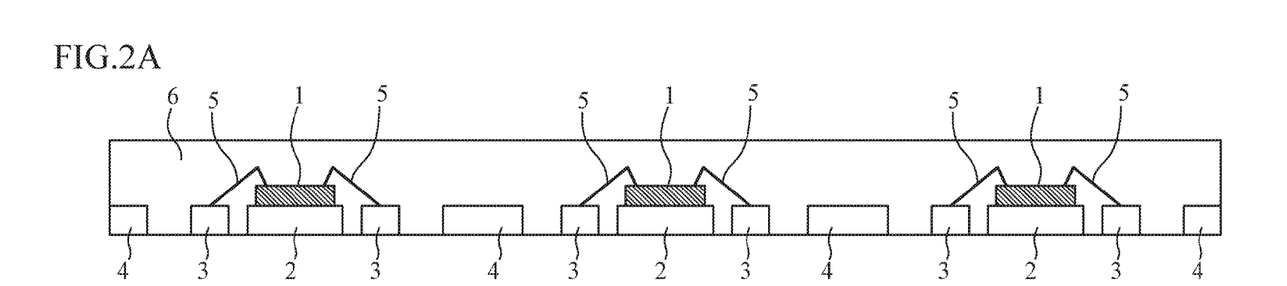
FIG. 2 is a diagram illustrating a manufacturing process of the semiconductor package according to the Embodiment 1 of the present invention.

In the manufacturing process of the semiconductor package, a plurality of sets of die pads 2, terminals 3 surrounding the die pads 2, and terminals 4 surrounding the terminals 3 are created at a predetermined interval by performing etching or the like on lead frame material. At this time, as illustrated in FIG. 2A, the terminals 4 for every pair of adjacent semiconductor packages are integrally formed.

Next, the IC chip 1 is disposed on the top surface of the die pad 2, and is bonded to the die pad 2 with silver paste, solder, or the like. The terminals 3 and a terminal on the IC chip 1 are connected via the wire 5. Subsequently, the IC chip 1 and the wire 5 are sealed by covering the surfaces of the lead frame material with the molded resin 6. A plurality of sets of chained packages as illustrated in FIG. 2A are thereby obtained.

Figure 2B:
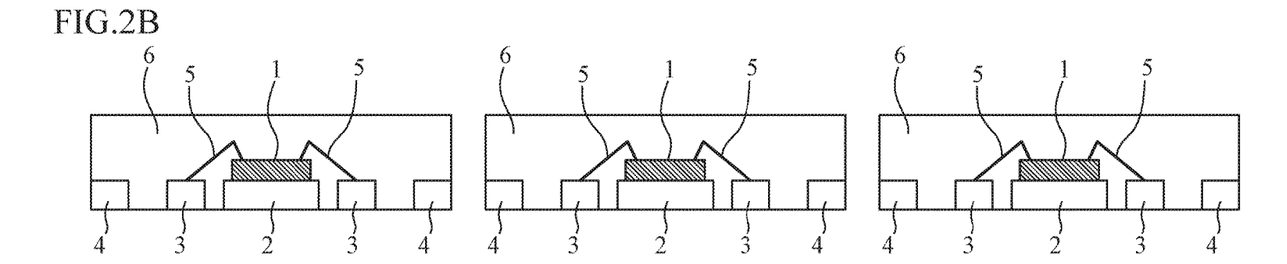
Figure 2C:
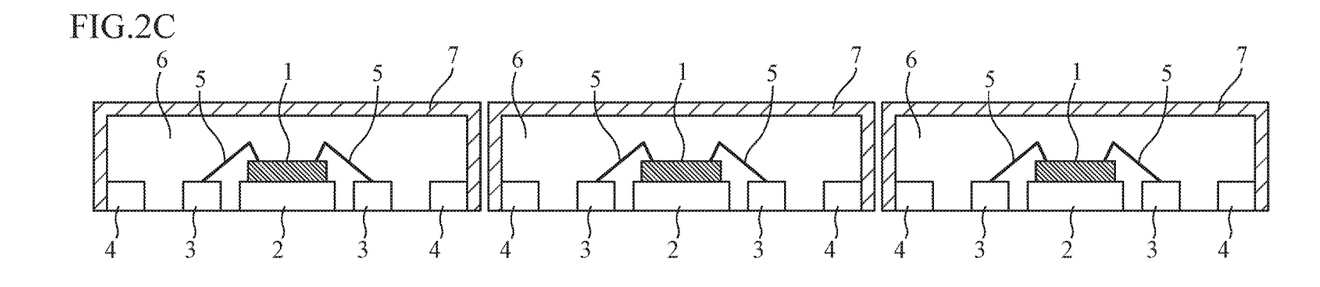

After that, as illustrated in FIG. 2B, the semiconductor packages are separated into individual semiconductor packages by cutting the terminals 4 for every pair of adjacent packages. Finally, as illustrated in FIG. 2C, each of the semiconductor packages is covered by the conductive coating 7.

FIG. 2 illustrates a case where the sets of chained packages are separated into individual packages prior to covering each package by the conductive coating 7. Alternatively, as illustrated in FIG. 3, the packages may be separated into individual packages after being covered by the conductive coating 7.

Figure 3A:
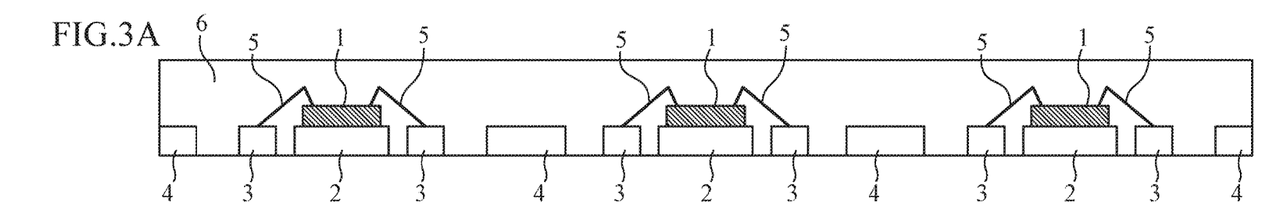
FIG. 3 is a diagram illustrating another manufacturing process of the semiconductor package according to the Embodiment 1 of the present invention.
Figure 3B:
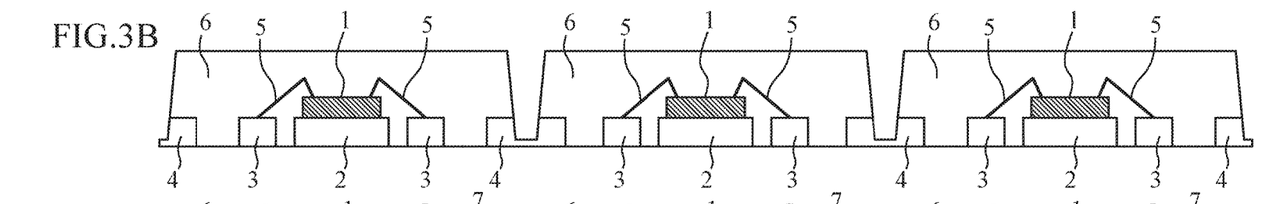
Figure 3C:
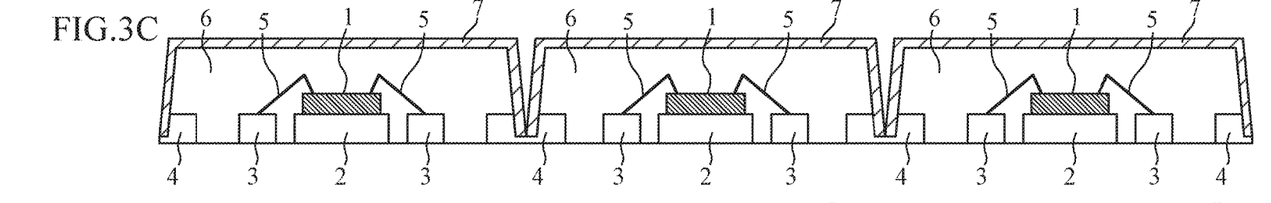
Figure 3D:
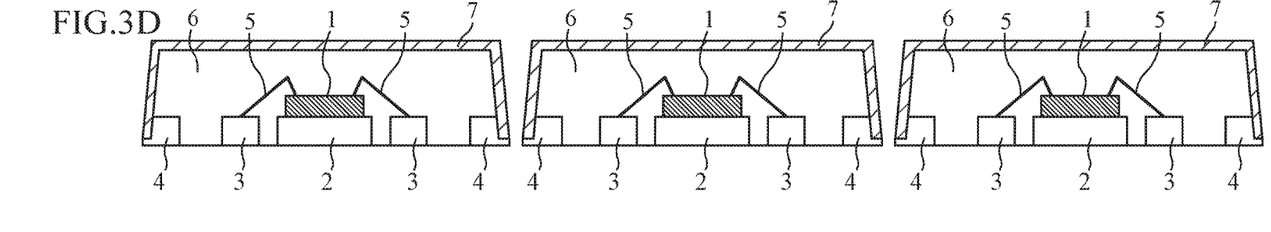

More specifically, a plurality of sets of chained packages as illustrated in FIG. 3A are partway cut at the terminals 4 for every pair of adjacent semiconductor packages as illustrated in FIG. 3B. Subsequently, as illustrated in FIG. 3C, each of the semiconductor packages are covered by the conductive coating 7. Finally, the packages are completely cut at the portions of the terminals 4 for every pair of adjacent semiconductor packages to be separated into individual packages as illustrated in FIG. 3D.

Note that, various methods, such as plating, spraying, or application of the conductive member, or adhesion of the conductive coating, can be applied to form the conductive coating 7.

After that, the semiconductor package is reflowed to, for example, the printed circuit board, and the die pad 2 and the terminals 3 and 4 are respectively connected to terminals formed on the printed circuit board. More specifically, the die pad 2 is connected to a terminal for heat radiation on the printed circuit board, the terminals 3 are connected to a signal terminal or a power supply terminal on the printed circuit board, and the terminal 4 is connected to a ground terminal on the printed circuit board.

Next, an operation of the semiconductor package having the above-described configuration will be described.

In the operation of the semiconductor package illustrated in FIG. 1, signals are input from one terminal 3a, and are input to the IC chip 1 via the wire 5. The signals input to the IC chip 1 are output from the other one terminal 3b via the wire 5 after having been subjected to a predetermined operation in the IC chip 1. Meanwhile, part of the signals input to the semiconductor package is radiated from the terminals 3, the wire 5, and the like, as electromagnetic waves.

However, the semiconductor package illustrated in FIG. 1 is constructed such that the terminal 4 and the conductive coating 7 are electrically connected, and the terminal 4 is connected to a ground terminal on a printed circuit board (not illustrated). Therefore, the IC chip 1, the wire 5, and the terminals 3 are shielded by the grounded terminal 4 and conductive coating 7. As a result, electromagnetic waves radiated from the terminals 3, the wire 5, and the like do not leak to the outside of the semiconductor package. In a similar manner, electromagnetic waves outside the semiconductor package are obstructed to enter the inside of the semiconductor package.

Heat occurring in the IC chip 1 is radiated via the die pad 2. Note that, in the semiconductor package of the present invention, the die pad 2 is excellent at heat radiation property because it is formed of lead frame material (metal).

Furthermore, in the present invention, a ceramic cap as in a conventional configuration is not used, but instead a lead frame is used. Therefore, the semiconductor package can be inexpensively formed. In addition, when the semiconductor package of the present invention is mounted on a printed circuit board or the like, a fin, a screw, and the like as in the conventional configuration are not needed. Thus, the semiconductor package can be downsized as compared to the conventional configuration.

As described above, according to the Embodiment 1, the lead frame includes the terminal 4 that is disposed to surround the terminals 3 and can be grounded, and the conductive coating 7 that covers the molded resin 6 and is electrically connected to the terminal 4. Therefore, the semiconductor package is capable of downsizing the semiconductor package with inexpensive, and having better heat radiation property and shielding property for electromagnetic waves as compared with the conventional configuration.

Embodiment 2

Figure 4:
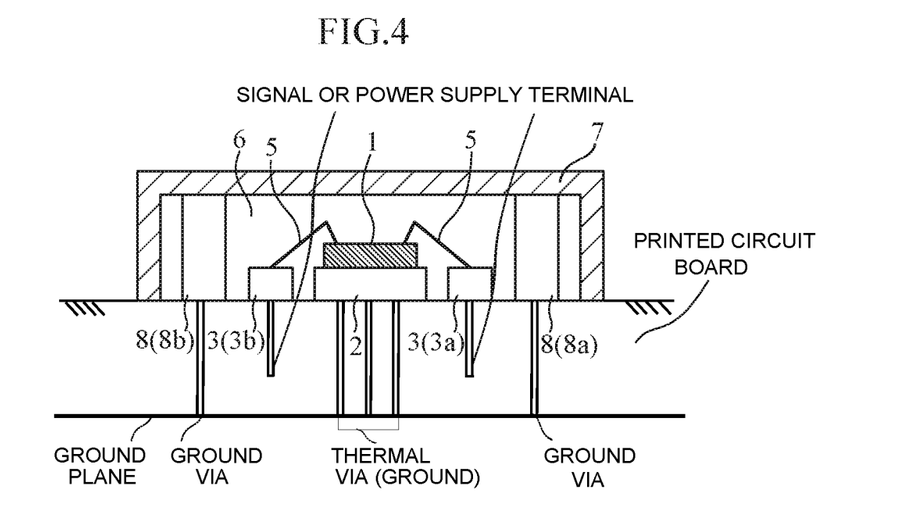
FIG. 4 is a cross-sectional diagram illustrating a configuration of a semiconductor package according to Embodiment 2 of the present invention.

FIG. 4 is a cross-sectional diagram illustrating a configuration of a semiconductor package according to Embodiment 2 of the present invention. The semiconductor package according to the Embodiment 2 illustrated in FIG. 4 is intended to replace, with a terminal (second terminal) 8, the terminal 4 of the semiconductor package according to the Embodiment 1 illustrated in FIG. 1. Since the other configurations are similar to those in the Embodiment 1, the same signs are assigned, and the description thereof will be omitted.

The terminal 8 is a terminal disposed to surround the terminals 3. The terminals 8 may be discretely disposed in an island-shaped manner, or may be connected to be a series. In the example illustrated in FIG. 4, two terminals 8a and 8b are depicted, each of which is the terminal 8. The bottom surface of the terminal 8 is exposed to the outside. The terminal 8 is formed to be connectable to a ground terminal on the above-described printed circuit board (or formed to be capable of grounding). In addition, the top surface of the terminal 8 is in contact with the conductive coating 7. The other surfaces of the terminal 8 are covered with molded resin 6. In other words, unlike the terminal 4 of the Embodiment 1, surfaces horizontal to the package plane (outer side) of the terminal 8 are not in contact with the conductive coating 7.

The conductive coating 7 is formed to cover the top surface and the sides of the molded resin 6, and the top surface of the terminal 8. The conductive coating 7 and the terminal 8 are electrically connected. Note that, if the terminals 8 are formed to be a series, the conductive coating 7 is not needed on the sides of the molded resin 6.

Also in the configuration illustrated in FIG. 4, part of the signals input to the semiconductor package is radiated from the terminals 3, the wire 5, and the like, as electromagnetic waves.

However, the semiconductor package illustrated in FIG. 4 is constructed such that the terminal 8 and the conductive coating 7 are electrically connected, and the terminal 8 is connected to a ground terminal on a printed circuit board (not illustrated). Therefore, the IC chip 1, the wire 5, and the terminals 3 are shielded by the grounded terminal 8 and the conductive coating 7. As a result, electromagnetic waves radiated from the terminals 3, the wire 5, and the like do not leak to the outside of the semiconductor package. In a similar manner, electromagnetic waves outside the semiconductor package are obstructed to enter the inside of the semiconductor package.

As described above, according to the Embodiment 2, even if the terminal 8 having the surfaces horizontal to the package plane, that are not in contact with the conductive coating 7, is used in place of the terminal 4, effects similar to those in the Embodiment 1 can be obtained.

In the structure in the Embodiment 1, the terminal 4 is exposed to the sides of the semiconductor package in a state before the conductive coating 7 covers it. Thus, as illustrated in FIGS. 2 and 3, when the semiconductor packages are separated into individual packages, the terminals 4 needs to be cut. When the terminals 4 are cut, there brings about such a problem that burrs may arise on the cut surface, and a blade used for cutting may be early worn out.

In contrast, in the structure in the Embodiment 2, the terminal 8 is not exposed to the sides of the semiconductor package in a state before the conductive coating 7 covers it. When the semiconductor packages are separated into individual packages, the molded resins 6 are cut. This may bring effects that the burrs do not arise on the cut surface, and the blade is prevented from being early worn out.

Embodiment 3

Figure 5:
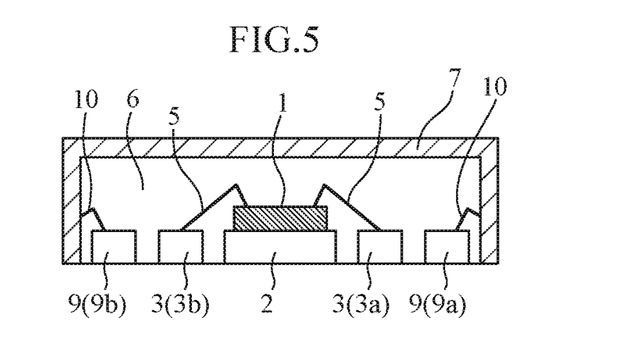
FIG. 5 is a cross-sectional diagram illustrating a configuration of a semiconductor package according to Embodiment 3 of the present invention.

FIG. 5 is a cross-sectional diagram illustrating a configuration of a semiconductor package according to Embodiment 3 of the present invention. The semiconductor package according to the Embodiment 3 illustrated in FIG. 5 is intended to replace, with a terminal (second terminal) 9, the terminal 4 of the semiconductor package according to the Embodiment 1 illustrated in FIG. 1, and also intended to add a connection member 10. Since the other configurations are similar to the Embodiment 1, the same signs are assigned, and the description thereof will be omitted.

The terminal 9 is a terminal disposed to surround the terminals 3. The terminals 9 may be discretely disposed in an island-shaped manner, or may be connected to be a series. In the example illustrated in FIG. 5, two terminals 9a and 9b are depicted, each of which is the terminal 9. The bottom surface of the terminal 9 is exposed to the outside. The terminal 9 is formed to be connectable to a ground terminal on the above-described printed circuit board (or formed to be capable of grounding). The other surfaces of the terminal 9 are covered with molded resin 6. In other words, unlike the terminal 4 of the Embodiment 1, surfaces horizontal to the package plane (outer side) of the terminal 9 are not in contact with the conductive coating 7.

In addition, the conductive coating 7 is formed to cover the top surface and the sides of the molded resin 6.

The connection member 10 electrically connects the terminal 9 and the conductive coating 7. A wire, a ribbon (gold ribbon, aluminum ribbon, etc.) having a wider width than that of a wire being a thin line, or the like may be used as the connection member 10.

Also in the configuration illustrated in FIG. 5, part of the signals input to the semiconductor package is radiated from the terminals 3, the wire 5, and the like, as electromagnetic waves.

However, the semiconductor package illustrated in FIG. 5 is constructed such that the terminal 9 and the conductive coating 7 are electrically connected via the connection member 10, and the terminal 9 is connected to a ground terminal on a printed circuit board (not illustrated). Therefore, the IC chip 1, the wire 5, and the terminals 3 are shielded by the grounded terminal 9 and the conductive coating 7. As a result, electromagnetic waves radiated from the terminals 3, the wire 5, and the like do not leak to the outside of the semiconductor package. In a similar manner, electromagnetic waves outside the semiconductor package are obstructed to enter the inside of the semiconductor package.

As described above, according to the Embodiment 3, even if the terminal 9 having the surfaces horizontal to the package plane, that are not in contact with the conductive coating 7, is used in place of the terminal 4, and the connection member 10 for electrically connecting the terminal 9 and the conductive coating 7 is provided, effects similar to those in the Embodiment 1 can be obtained.

In addition, in the structure in the Embodiment 3, the terminal 9 is not exposed to the sides of the semiconductor package in a state before the conductive coating 7 covers it.

Figure 6:
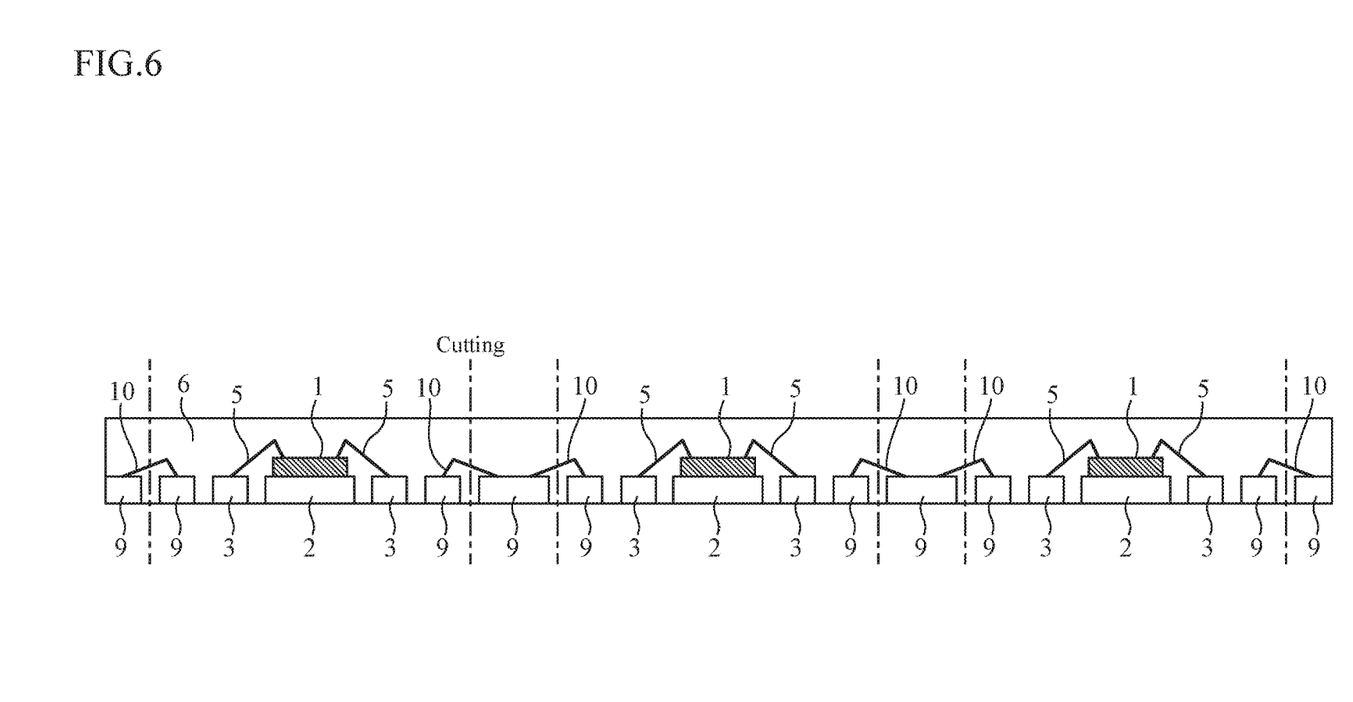
FIG. 6 is a diagram illustrating a manufacturing process of the semiconductor package according to the Embodiment 3 of the present invention.

Thus, when the semiconductor packages are separated into individual packages as illustrated in FIG. 6, the molded resins 6 and the connection members 10 are cut. This may bring effects that burrs do not arise on the cut surface, and the blade is prevented from being early worn out.

In the present invention, the embodiments can be freely combined, an arbitrary constituent element in the embodiments can be modified, or an arbitrary constituent element in the embodiments can be omitted, within the scope of the invention.

The semiconductor package according to the present invention is suitable for a semiconductor package which is required to be downsized with inexpensive, and to have better heat radiation property and shielding property for electromagnetic waves as compared with the conventional configuration.

1 IC chip (electronic component)
2 die pad
3 terminals
4, 8, 9 terminal (second terminal)
5 wire
6 molded resin
7 conductive coating (conductive member)
10 connection member

The invention claimed is:

1. A semiconductor package comprising:
an electronic component;
a lead frame that includes a die pad, on which the electronic component is fixed, and terminals being internal wires, the die pad being formed of a material of the lead frame and connected to a terminal for heat radiation of a printed circuit board;
a wire to connect the electronic component and the terminals;
molded resin to seal the electronic component and the wire;
a second terminal that is disposed to surround the terminals on a package plane and can be grounded, the second terminal being included in the lead frame, and being a one-piece terminal having a top surface exposed from an upper surface of the molded resin, and having a bottom surface exposed from a lower surface of the molded resin opposite to the upper surface and coplanar with the lower surface of the molded resin; and
a conductive member having an upper portion that covers the upper surface of the molded resin and side portions that cover side surfaces of the molded resin, the second terminal being spaced from the side portions of the conductive member and extending such that the top surface contacts the upper portion.

2. The semiconductor package according to claim 1, wherein the second terminal is disposed such that a surface of the second terminal, which is horizontal to the package plane, is not in contact with the conductive member.

3. The semiconductor package according to claim 1, wherein
the second terminal is surrounded by the molded resin with the top surface exposed from the molded resin.

* * * * *